United States Patent
Kelemen (12)

(10) Patent No.: US 6,205,033 B1
(45) Date of Patent: Mar. 20, 2001

(54) ELECTRONIC ASSEMBLY CIRCUIT BOARD GUIDE APPARATUS

(75) Inventor: Joe Kelemen, Alberto (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/214,000

(22) Filed: Dec. 17, 1998

Related U.S. Application Data
(60) Provisional application No. 60/089,888, filed on Jun. 19, 1998.

(51) Int. Cl.[7] .................................................. H05K 7/14

(52) U.S. Cl. .................. 361/802; 361/756; 361/759; 361/801; 361/727; 361/788; 174/250; 248/694

(58) Field of Search ................... 361/726–727, 361/756, 759, 752, 753, 788, 801, 802; 174/250; 248/694

(56) References Cited

U.S. PATENT DOCUMENTS

| | | | |
|---|---|---|---|
| 3,731,157 | * | 5/1973 | Reimer .......................... 317/101 DH |
| 4,700,275 | * | 10/1987 | Wood .................................. 361/684 |
| 5,666,271 | * | 9/1997 | Kim et al. ............................ 361/726 |
| 5,751,558 | * | 5/1998 | Gullicksrud et al. ................ 361/801 |
| 5,805,429 | * | 9/1998 | Andersson .......................... 361/799 |

* cited by examiner

*Primary Examiner*—Jeffrey Gaffin
*Assistant Examiner*—Tuan Dinh
(74) *Attorney, Agent, or Firm*—John D. Crane

(57) ABSTRACT

The circuit board guide apparatus is comprised of multiple guides (105–107) that hold the edges of the circuit boards. The apparatus is additionally comprised of the rear portion (200) having a backplane retention portion and a rear snap-in sel-fretention feature. The apparatus has a front portion (300) that comprises the snap-in, self-retention feature. The guide retention devices (110–112) elevate the guides (105–107) from the sides of the electronic assembly enclosure and keep the guides (105–107) separate and parallel.

8 Claims, 3 Drawing Sheets

ELECTRONIC ASSEMBLY CIRCUIT BOARD GUIDE APPARATUS

RELATED APPLICATIONS

This application claims the benefit of U.S. Provisional Application No. 60/089,888, filed Jun. 19, 1998.

BACKGROUND OF THE INVENTION

I. Field of the Invention

The present invention relates generally to mechanical card guides for circuit boards and electrical backplanes.

II. Description of the Related Art

Methods for installation and alignment of circuit boards and backplanes within an electronic assembly typically involve a multi-step process. The process typically includes installing the backplane in an aligned orientation within the electronic assembly. The circuit board guides are then installed in the electronic assembly. The guides must be aligned with the backplane in order for the connectors on the circuit boards to properly mate with the connectors on the backplane.

If either the backplane or the circuit board guides are not aligned properly, the circuit boards will not mate with the backplane connectors. To get the backplane and circuit board guides properly aligned requires additional assembly time during the manufacturing process. There is a resulting unforeseen need for a self-aligning backplane and circuit board guide mechanism.

SUMMARY

The circuit board guide apparatus of the present invention provides a selfaligning function for the backplane and circuit boards of an electronic assembly. The apparatus is comprised of a plurality of circuit board guides. Each circuit board guide is substantially parallel to the remaining circuit board guides. In the preferred embodiment, the guides are all in the same plane.

A guide retention device is coupled to the plurality of circuit board guides. The guide retention device separates and retains the plurality of circuit board guides in the parallel manner. In the preferred embodiment, a plurality of the guide retention devices is spaced along the circuit board guides to provide stability to long guides. In one embodiment, the guide retention devices extend downward from the circuit board guides to provide elevation of the guides from the side of an enclosure.

A backplane retaining portion is coupled to the rear portion of the plurality of circuit board guides. The backplane retaining portion, in the preferred embodiment, comprises a plurality of indentations, for accepting raised areas on a backplane. Semi-circular extensions in front of the indentations guide the raised areas from the backplane into the indentations.

The backplane retaining portion also has a retaining lip for holding the backplane substantially immobile against the indentations. The lip has a slope that allows the edge of the backplane to be slid rearward, so that the raised areas can engage the indentations, before snapping back on the edge of the backplane to retain it.

DETAILED DESCRIPTION OF THE PREFERRED EMBODIMENT

The electronic assembly circuit board guide apparatus of the present invention provides a self-alignment feature for the backplane relative to the electronic assembly enclosure. The apparatus also provides a snap-in, self-retention feature to hold the circuit board guide apparatus in the electronic assembly.

Figure 1:
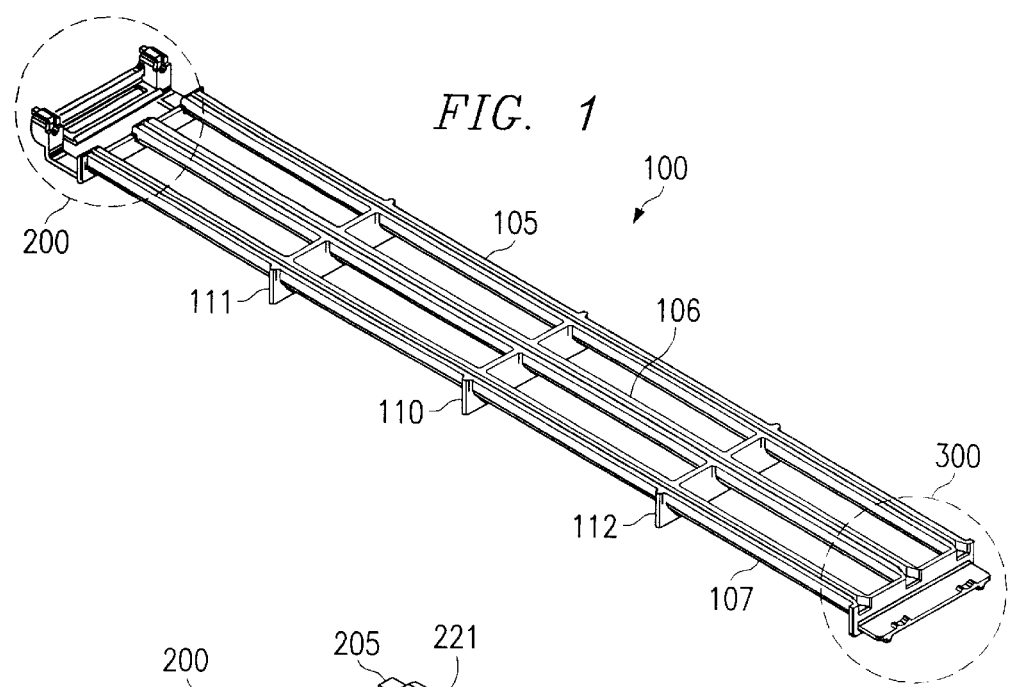
FIG. 1 shows the electronic assembly circuit board guide of the present invention.

FIG. 1 illustrates the circuit board guide apparatus. The apparatus is comprised of multiple guides (105–107) that hold the edges of the circuit boards. The apparatus is additionally comprised of the rear portion (200) having a backplane retention portion and a rear snap-in self-retention feature. The apparatus also has a front portion (300) that comprises the snap-in, self-retention feature.

While FIG. 1 shows three guides (105–107), this is for illustration purposes only. Alternate embodiments have different quantities of guides depending on the number of circuit boards required in the electronic assembly.

The circuit board guides are held parallel to each other and elevated by guide retention devices (110–112). These devices (110–112), in the preferred embodiment, are molded as one unit with the guides and backplane retention portion. Alternate embodiments may connect the guides (105–107) to the guide retention devices (110–112) separately.

The guide retention devices (110–112) elevate the guides (105–107) from the sides of the electronic assembly enclosure. The required distance from the sides of the enclosure determines the height of the guide retention devices (110–112). In the preferred embodiment, this distance is determined by the amount of airflow desired around the circuit boards.

In alternate embodiments, the elevation is determined by the size of the circuit boards. If it is desired to install smaller circuit boards in a generic size enclosure, the guide retention devices (110–112) can be made taller to position the guides (105–107) further from the sides and closer to an opposing circuit board guide within the enclosure. This allows the circuit boards, backplane, and circuit board guides (105–107) to be tightly mounted within the enclosure such that there is no movement of the circuit board guides with respect to the enclosure.

The guide retention devices (110–112) additionally extend beyond the top and bottom guides by a distance required to hold the guides (105–107) immobile in the enclosure. As before, the top and bottom of the retention devices (110–112) can be extended beyond the top and bottom guides depending on the number of guides (105–107) and the size of the enclosure.

In the preferred embodiment, the guide retention devices are substantially perpendicular to the circuit board guides and also substantially parallel to the other guide retention devices. Alternate embodiments do not require these devices to be parallel to each other or perpendicular to the guides. The guide retention devices (110–112) in alternate embodiments can be employed in any direction that still maintains a predetermined distance between guides (105–107) and a predetermine distance from the sides of the enclosure.

Figure 2:
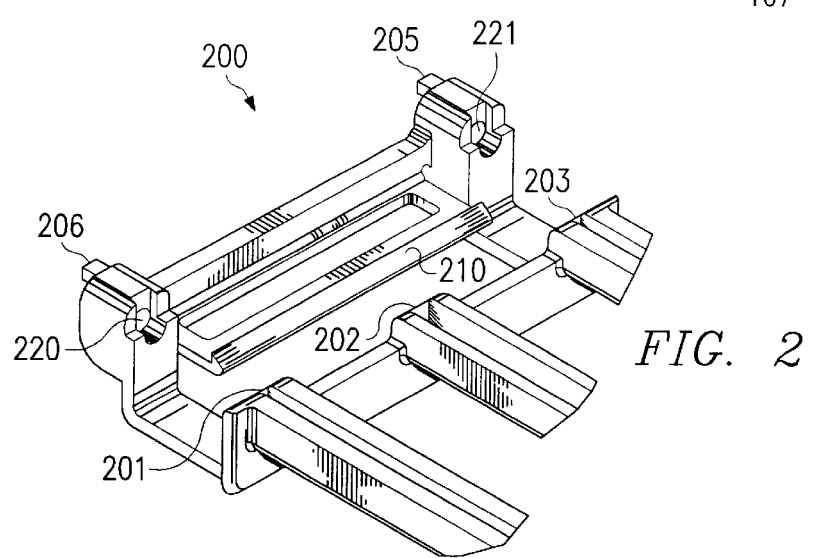
FIG. 2 shows a rear detail of the circuit board guide of FIG. 1.

FIG. 2 illustrates the backplane retention portion (200) of the circuit board guide apparatus of the present invention. This portion also incorporates the rear snap-in features of the apparatus.

The backplane retention portion is comprised of multiple alignment holes (220 and 221) that align the backplane with the circuit board guides. These holes are used by raised portions or pegs on the backplane to allow the backplane to snap into only one position in the backplane retention portion. An example of such a backplane is illustrated in FIG. 5.

Figure 5:
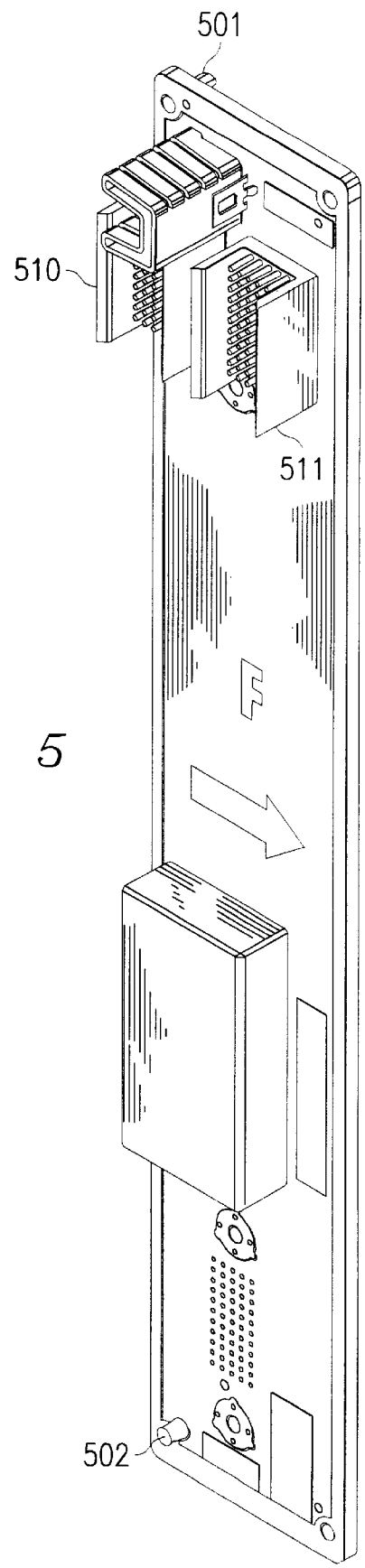
FIG. 5 shows an example of a backplane to be used in accordance with the present invention.

The backplane in FIG. 5 is comprised of the required connectors (510 and 511) that are aligned with the circuit board guides. These connectors (510 and 511) accept the connectors from the circuit boards as they are slid through the circuit board guides into the backplane.

The back portion of the backplane has the pegs or raised areas (501–502) that match up with the backplane alignment holes in the backplane retention portion of the circuit board guide apparatus. These pegs or raised areas (501–502) hold the backplane immobile, in two dimensions, in the backplane retention portion.

Referring again to FIG. 2, the backplane retention portion is additionally comprised of a backplane edge retainer (210). The edge retainer (210) holds the backplane immobile in the apparatus in a third direction. The edge retainer (210) is comprised of a sloping lip that allows the backplane to slide along the lip while being inserted but then retains the backplane once it is pushed beyond the lip.

The rear snap-in feature (205 and 206) illustrated in FIG. 2 are pegs or extensions that are inserted into holes or indentations in the electronic assembly. The rear snap-in feature (205 and 206) aligns the circuit board guide apparatus within the electronic assembly and also holds it in place.

FIG. 2 additionally illustrates the circuit board guide stops (201–203) in each circuit board guide. These stops (201–203) impede the insertion of the circuit boards within the guides beyond the point where the circuit board butts up against the stop (201–203).

In alternate embodiments, one of the rear snap-in feature extensions of the apparatus has a different shape and/or size than the remaining extensions. This would allow the insertion of the apparatus into the electronic assembly enclosure in only one way if a respective insertion hole or indentation in the electronic assembly enclosure has the same size or shape.

In a similar manner, different size and/or shape alignment holes allow a backplane, with a respective size and/or shape raised area to be inserted in only one way to eliminate the possibility of inserting the backplane improperly. This reduces the amount of labor required to remove the backplane and reinstall it in the proper configuration.

Figure 3:
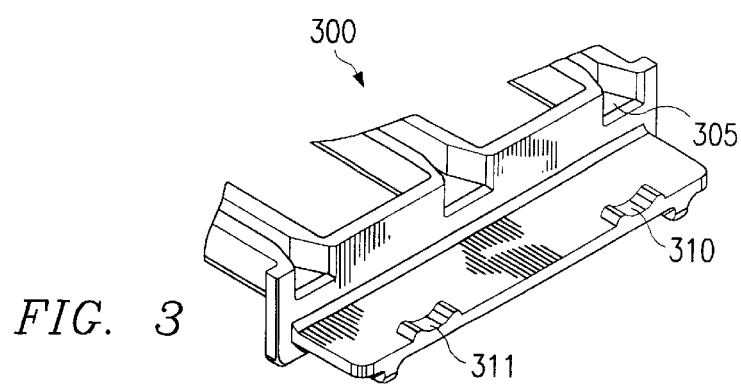
FIG. 3 shows a front detail of the circuit board guide of FIG. 1.

FIG. 3 illustrates the front portion (300) of the circuit board guides. The guides have a flared initial portion (305) to allow easier insertion of circuit boards.

The front of the circuit board guides also includes the front snap-in feature (310 and 311). This feature (310 and 311) holds the front of the electronic assembly. Complimentary features on the front plate slide over the front snap-in feature (310 and 311) and lock into place. This holds the front plate immobile.

The preferred embodiment of the front snap-in feature (310 and 311) is shown as a radiused indentation. Alternate embodiments use other shapes as required such as square or saw tooth indentations.

Figure 4:
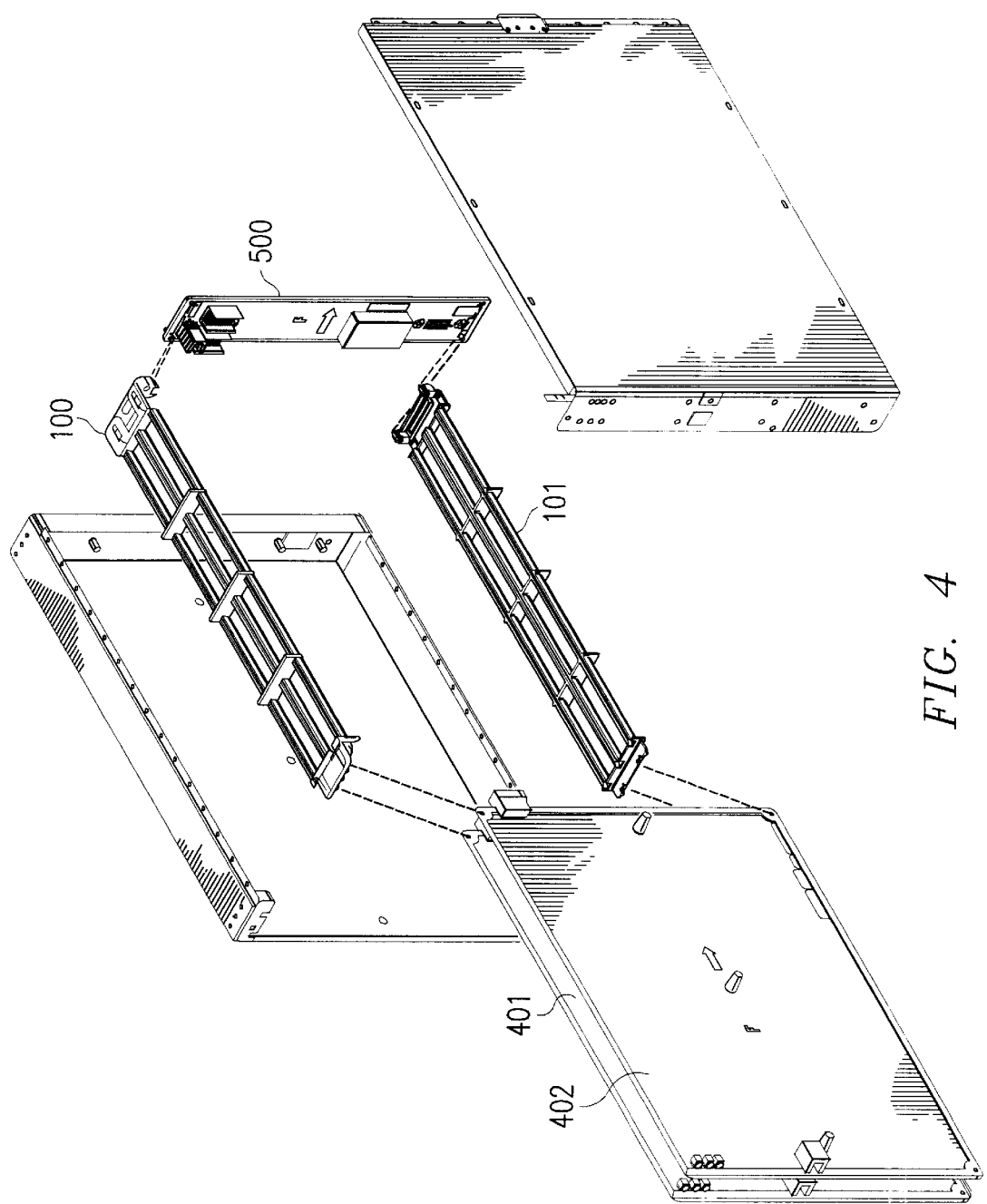
FIG. 4 shows an exploded view of an electronic assembly incorporating the electronic assembly circuit board guide of the present invention.

An electronic assembly incorporating the circuit board guide apparatus of the present invention is illustrated in FIG. 4. This figure illustrates a two guide apparatus (100 and 101) for holding two circuit boards (401 and 402). A circuit board guide apparatus (100 and 101) is located on either side of the electronic assembly. The rear snap-in feature is inserted into the depressions in the rear panel of the electronic assembly. The backplane (500) is inserted into the rear, backplane portion of each apparatus (100 and 101) and locked in. The circuit boards (401 and 402) are inserted into the guides until the connectors on the circuit boards (401 and 402) connect with the connectors on the backplane (500). The front plate of the electronic assembly then snaps into the front snap-in feature of each circuit board apparatus (100 and 101).

In summary, the circuit board guide apparatus of the present invention can be inserted into an electronic assembly enclosure. The self-aligning, snap-in feature in the rear and front of the apparatus provides alignment and immobilization of the apparatus without additional labor. This alignment is important for later coupling of the electronic assembly to another backplane or electronic assembly. In this case, precise alignment and immobilization of the backplane in the first electronic assembly is required and provided by the present invention.

I claim:

1. A circuit board apparatus comprising:
   a plurality of circuit board guides, each circuit board guide substantially parallel to the remaining circuit board guides of the plurality of circuit board guides;
   a guide retention device, coupled to the plurality of circuit board guides, for separating and retaining the plurality of circuit board guides; and
   a backplane retention portion, coupled to the plurality of circuit board guides, the backplane retention portion comprising a sloping retaining lip that allows a backplane to slide along the lip while a card is being inserted but that retains the backplane immobile in a planarly perpendicular direction relative to the backplane.

2. The apparatus of claim 1 wherein the backplane retaining portion further comprises rearward extending protrusions for insertion into an enclosure for alignment to prevent movement in a planarly parallel direction relative to the backplane.

3. The apparatus of claim 1 wherein a first indentation of the plurality of indentations comprises a shape that is different than the shape of the remaining indentations of the plurality of indentations.

4. The apparatus of claim 2 wherein a first rearward extending protrusion of the plurality of extending protrusions has a shape that is different than the shape of the remaining extending protrusions of the plurality of extending protrusions.

5. The apparatus of claim 1 wherein a first indentation of the plurality of indentations comprises a size that is different than the size of the remaining indentations of the plurality of indentations.

6. The apparatus of claim 2 wherein a first rearward extending protrusion of the plurality of extending protrusions has a size that is different than the size of the remaining extending protrusions of the plurality of extending protrusions.

7. A circuit board guide apparatus comprising:
   a plurality of circuit board guides, each circuit board guide substantially parallel to the remaining circuit board guides of the plurality of circuit board guides, each circuit board guide comprising a flared portion at a front portion of the guide and a guide stop at the end of the guide the plurality of circuit board guides being in a first plane;

a front extension coupled to the front portion of the guide, the front extension being in a second plane that is parallel to and offset from the first plane, the front extension comprising protrusions extending upward from the second plane in the direction of the first plane, the protrusions having a shape that accepts a complimentary shape for alignment of the apparatus;

a plurality of guide retention devices, coupled to the plurality of circuit board guides, for separating and retaining the plurality of circuit board guides in a parallel manner, the guide retention devices having means for elevating the plurality of circuit board guides according to the size of the circuit board that is to be installed so as to securely hold the circuit board; and a backplane retention portion, coupled to the plurality of circuit board guides, the backplane retention portion comprising:

a retaining lip for holding the backplane substantially immobile against the indentations; and a U-shaped depression in front of the retaining lip, the depression having the same depth as the means for elevating.

8. An electronic assembly including a plurality of circuit boards, the assembly comprising:

a plurality of circuit board guides, each circuit board guide substantially parallel to the remaining circuit board guides of the plurality of circuit board guides;

a front extension coupled to a front portion of the guide, the front extension comprising protrusions extending upward from the front extension, each protrusion having a shape that accepts a front panel extension of the plurality of extensions;

a guide retention device, coupled to the plurality of circuit board guides, for separating and retaining the plurality of circuit board guides, each of the guide retention devices defining an elevation amount according to a size of the circuit boards that are to be installed; and a backplane retaining portion, coupled to the plurality of circuit board guides, the backplane retaining portion comprising a plurality of indentations, for accepting raised areas on a backplane, and a retaining lip for holding the backplane substantially immobile against the indentations.

* * * * *